United States Patent [19]

Fling

[11] Patent Number: 5,027,017
[45] Date of Patent: Jun. 25, 1991

[54] SYNC TIP CLAMP CIRCUITRY

[75] Inventor: Russell T. Fling, Naperville, Ill.

[73] Assignee: RCA Licensing Corporation, Princeton, N.J.

[21] Appl. No.: 467,608

[22] Filed: Jan. 19, 1990

[51] Int. Cl.$^5$ .............................................. H03K 5/08
[52] U.S. Cl. .................................. 307/555; 307/562; 307/568; 358/171
[58] Field of Search ............... 307/540, 550, 552–558, 307/568, 562; 358/34, 79, 171, 172, 176

[56] References Cited

U.S. PATENT DOCUMENTS

| | | | |
|---|---|---|---|
| 4,296,437 | 10/1981 | Geurts | 358/173 |
| 4,470,066 | 9/1984 | Wölber et al. | 358/171 |
| 4,481,433 | 11/1984 | Fisher et al. | 307/546 |
| 4,729,026 | 3/1988 | Suzuki et al. | 358/168 |
| 4,859,871 | 8/1989 | Kobayashi et al. | 307/264 |

FOREIGN PATENT DOCUMENTS

| | | | |
|---|---|---|---|
| 0117970 | 6/1985 | Japan | 307/540 |
| 0023224 | 1/1987 | Japan | 307/540 |

Primary Examiner—John Zazworsky
Attorney, Agent, or Firm—Joseph S. Tripoli; Eric P. Herrmann; James B. Hayes

[57] ABSTRACT

A clamp circuit includes a coupling capacitor connected between signal input and signal output terminals. A constant current sink and a controlled current source are connected to the output terminal. A comparator, coupled to the output terminal via a lowpass filter, generates signals for conditioning the controlled current source to source current whenever the output terminal exhibits a potential which differs from a predetermined reference in a predetermined polarity sense.

13 Claims, 2 Drawing Sheets

SYNC TIP CLAMP CIRCUITRY

This invention relates to circuitry for re-establishing the D.C. level of an A.C. coupled signal.

BACKGROUND OF THE INVENTION

Many time varying signals are generated with amplitude swings referenced to a D.C. value, with both the D.C. value and signal amplitude excursions conveying information. For example, conventional video signals include a time varying component which conveys image structure information referenced to a D.C. value which establishes the relative brightness of the scene.

In transmitting such signals the D.C. reference value may be lost, thus it becomes necessary at the receiver to reestablish such reference. Typically, in television receivers D.C. restoration is performed by clamping the tips of the horizontal synchronizing pulses to a predetermined D.C. value. This is accomplished by (a) detecting the video signal to generate a pulsed signal coincident with the horizontal synchronizing pulses; (b) applying the received video signal to the input terminal of a coupling capacitor; (c) using the pulsed signal to condition a switch to apply a constant reference value to the output terminal of the capacitor during the horizontal synchronizing intervals; and (d) accessing D.C. restored video signal from the output terminal of the coupling capacitor.

There is a disadvantage to this type of clamping system in that the pulsed signal may introduce switching transients into the video signal. This is particularly true when the clamping circuitry is resident on an integrated circuit including additional analog signal processing circuitry. The potential for introducing such transients is enhanced if the integrated circuitry is realized with high impedance field effect devices.

SUMMARY OF THE INVENTION

The present invention is directed to clamp circuitry which reduces the possibility of coupling switching transients into the processed signal either at the clamp circuitry per se or associated processing circuitry. The present clamp circuitry includes a coupling capacitor having an input terminal to which the signal to be D.C. restored is applied and an output terminal from which clamped signal is available. A comparator is coupled to the output terminal of the coupling capacitor via a lowpass filter and generates an output signal related to the difference between the potential passed by the lowpass filter and a predetermined value. A variable current source coupled to the output terminal of the coupling capacitor is conditioned by the output signal from the comparator to charge the capacitor to a predetermined potential.

DETAILED DESCRIPTION

The invention will be described in terms of conventional video signals including horizontal synchronizing components, however it should be appreciated that it is applicable to any signals having, e.g., pulsed intervals, the amplitude of which bears some relationship to the D.C. reference value of the signal.

Figure 1:
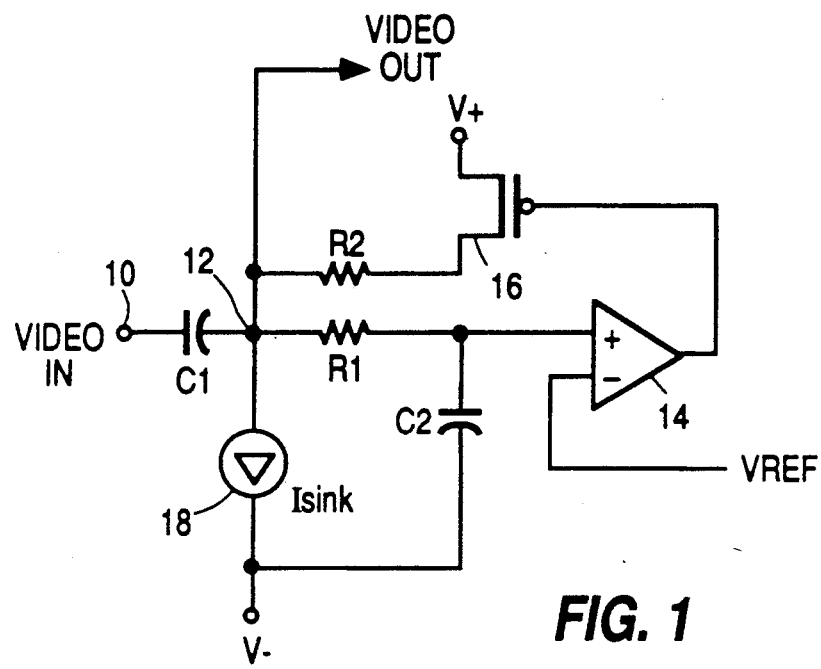
FIGS. 1 and 2 are schematic block diagrams of alternative clamp circuitry embodying the invention.

Referring to FIG. 1 the video signal to be clamped is applied to the input terminal 10 of a coupling capacitor C1. The presumption is made that the horizontal synchronizing pulses are negative-going pulses and that positive-going excursions of active video represent white areas of transmitted images. The output terminal 12 of the capacitor C1 provides the D.C. restored or clamped video output signal.

A constant current source 18 is coupled to terminal 12 and sinks current from the capacitor C1 tending to drive terminal 12 to a relatively negative potential. The effective time constant of the combination of current source 18 and capacitor C1 is in the order of 70 milliseconds or approximately 1000 horizontal line intervals. The current source 18 insures that the system does not lock up at some erroneous relatively positive D.C. value.

Video signal from terminal 12 is coupled to a lowpass filter consisting of a series resistor R1 and a shunt capacitor C2. This lowpass filter is designed to pass the horizontal synchronizing pulses and to attenuate noise and the higher frequency components of the active video signal including burst. An exemplary suitable time constant for the combination of R1 and C2 is 0.59 microseconds. Note however that resistor R1 should be sufficiently large to preclude loading of terminal 12.

Low pass filtered video signal is coupled to the non-inverting input terminal of a comparator circuit 14. A reference potential VREF is applied to an inverting input terminal of the comparator 14. Comparator 14 generates a substantially bilevel output signal which is relatively positive when the amplitude of the lowpass filtered video signal is greater than VREF and relatively negative when VREF is greater than the amplitude of the video signal.

The value VREF (in the illustrated example) is selected to equal the D.C. potential value to which the horizontal synchronizing pulses of the video output signal are to be clamped. It will be recognized however that if D.C. attenuation is built into the lowpass filter, then the clamp potential will be offset from VREF.

Output signal from the comparator 14 is coupled to the gate electrode of a p-type field effect transistor 16 which is connected to operate as a common source amplifier. The drain electrode of transistor 16 is coupled to terminal 12 via a resistor R2. Transistor 16 and resistor R2 form a current source for selectively supplying current to terminal 12.

During horizontal synchronizing pulse intervals the amplitude of the video signal at terminal 12 will typically be less than VREF due to the constant discharge of capacitor C1 by current source 18. As such comparator 14 will provide a relatively negative output signal which conditions transistor 16 into conduction to charge terminal 12 to the potential VREF. When terminal 12 attains the value VREF or the end of the horizontal synchronizing period occurs in which case the video signal goes relatively positive, the output signal from comparator 14 becomes relatively positive. This conditions transistor 16 out of conduction, effectively removing it from the circuit. The effective time constant of the combination of capacitor C1, resistor R2 and transistor 16 (when conducting) is of the order of one millisecond. Thus several line intervals are required to achieve clamping at the desired potential. The time constant may be reduced to provide a faster response time.

In order to reduce erroneous occurrences of clamp operation at other than horizontal synchronizing pulse intervals, to minimize the effects of noise on the amplitude of the clamping level and also to slow output transitions of the comparator output signal and thereby to reduce switching transients, it has been found to be advantageous to include lowpass filter circuitry between the comparator 14 and transistor 16. Such lowpass filter function may of course be integral to the comparator circuitry.

Figure 2:
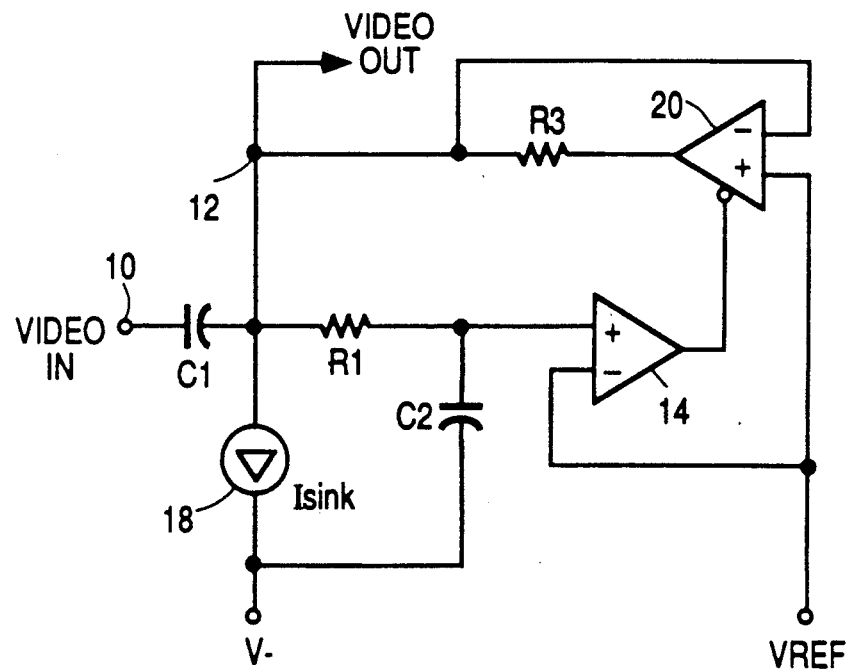

The circuitry illustrated in FIG. 2 is similar to that of FIG. 1 with the exception of the circuitry for supplying charging current to terminal 12. That is, transistor 16 and resistor R2 are replaced by a gated amplifier 20 and a resistor R3. The amplifier 20 has a control input terminal coupled to the output terminal of comparator 14. Amplifier 20, responsive to the control signal from the comparator, is conditioned to be operative when the video signal at terminal 12 is less than VREF, and is conditioned to provide a high output impedance when the video signal is greater than VREF.

A non-inverting input terminal of the amplifier 20 is coupled to the reference potential VREF. The resistor R3 is coupled between an output and inverting input terminals of amplifier 20 to configure it as a voltage follower. The interconnection of the resistor R3 and inverting input terminal is connected to terminal 12. The time constant of the combination of resistor R3 and capacitor C1 is relatively short. The amplifier 20 and resistor R3 provide current to charge or discharge capacitor C1.

The advantage of the FIG. 2 embodiment is that the charging current provided by resistor R3 is a function of the difference between VREF and the potential at terminal 12, by virtue of the follower configuration of amplifier 20. The charging current is not affected by perturbations (e.g., due to noise) present on the control signal generated by the comparator 14.

Figure 3:
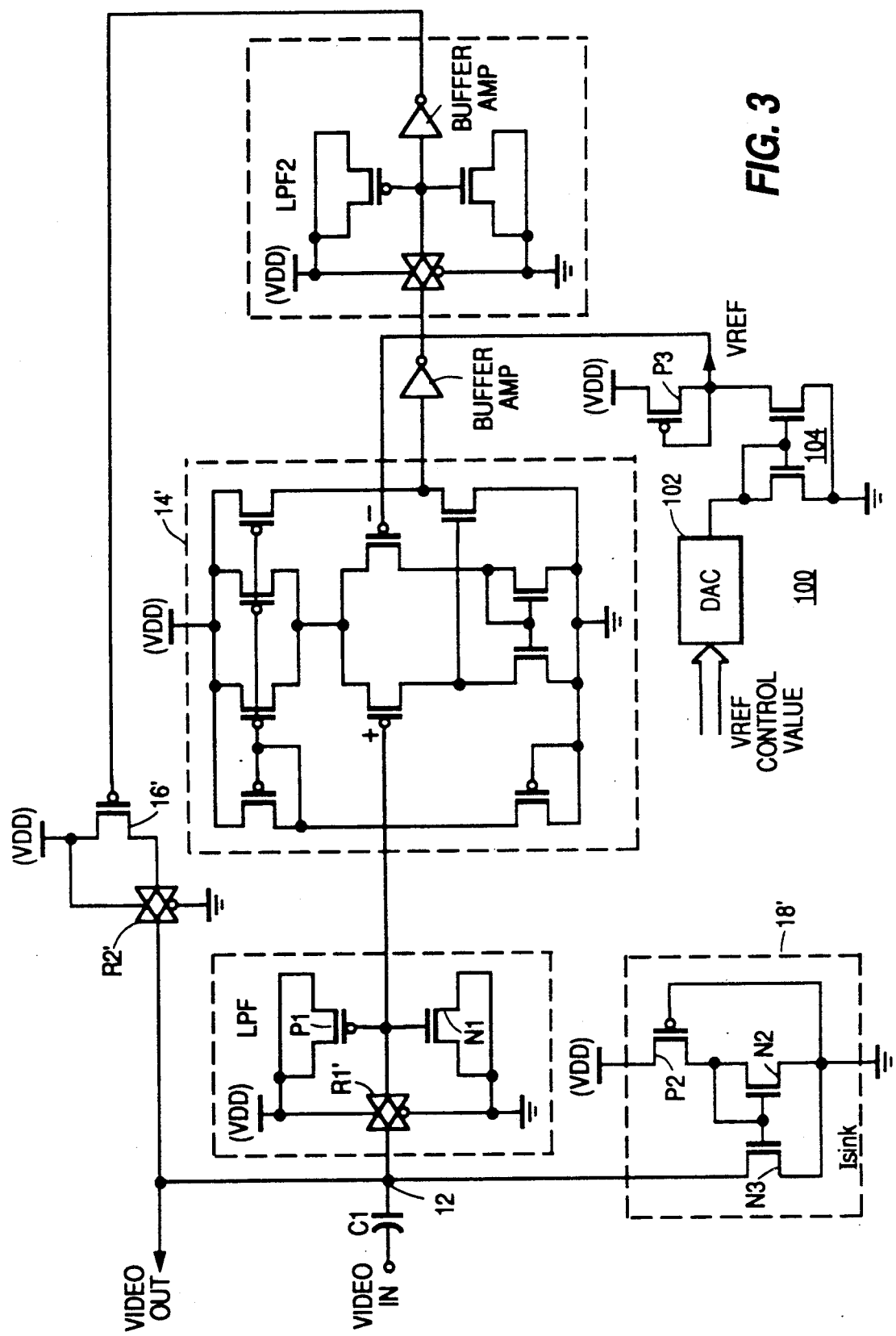
FIG. 3 is a detailed schematic diagram of exemplary circuitry for realizing the FIG. 1 system.

FIG. 3 illustrates an embodiment similar to the system shown in FIG. 1 which is realized as a field effect transistor integrated circuit. The FIG. 3 circuitry also includes a lowpass filter connected between the output of the comparator and the input of the current source transistor 16'.

In FIG. 3 circuit elements or blocks designated with primed numbers correspond to like numbered elements in FIG. 1 and perform similar functions. Transistors having circles on their gate electrodes are p-type devices and transistors without circles on their gate electrodes are n-type devices. The comparator 14' is of conventional design and as such will not be described in detail.

The current sink 18' includes a current generator including transistors P2 and N2 which generate a potential at their interconnection related to the current passed in their series connected configuration. Transistors N2 and N3 are connected in a current mirror configuration such that the current provided by transistor N3 is related to the current passed by transistor N2 according to the ratio of their channel areas.

The lowpass filter (LPF) coupled to terminal 12 includes a resistive element R1' consisting of a pair of transistors having high source-to-drain impedance and connected in the form of a conventional complementary transistor transmission gate with both of the complementary transistors biased into conduction by respective supply potentials VDD and ground. The capacitor (C2) for the LPF is realized via the gata-to-substrate/channel capacitances of a pair of complementary transistors P1 and N1. The output lowpass filter LPF2 is realized in a like manner. An examplary time constant for the filter LPF2 is of the order of 0.1 microsecond.

The resistor R2' connected between the current source transistor 16' and terminal 12 is also realized with a pair of high impedance transistors arranged in the form of a conventional complementary transistor transmission gate, and which is biased into conduction by the supply potentials.

The reference potential VREF is generated by a reference generator 100. The generator 100 is made programmable by virtue of being arranged to accept digital control value from a system control element such as a microprocessor (not shown). The reference control values are applied to a digital-to-analog converter 102 which provides respective output values corresponding to the control signals. The current from the digital-to-analog converter is coupled to the input connection of a current mirror amplifier 104. Output current from the current mirror amplifier 104 is coupled to a p-type transistor P3 arranged as a current-to-voltage converter which provides the potentials VREF corresponding to the applied reference control values.

What is claimed is:

1. Clamping circuitry comprising:
   a signal input terminal and a signal output terminal;
   a coupling capacitor coupled between said signal input and output terminals;
   a lowpass filter having an input terminal coupled to said signal output terminal, and having an output terminal;
   a comparator having a first input terminal coupled to the output terminal of said lowpass filter, and having a second input terminal coupled to a source of reference potential, for generating a control signal related to differences between signal provided by said lowpass filter and said reference potential;
   a controllable current source, having a control input terminal coupled to said comparator, and an output terminal coupled to said signal output terminal, and responsive to said control signal, for providing current to said capacitor in a direction tending to establish a potential at said signal output terminal having a predetermined relationship to said reference potential when said reference potential differs from signal provided by said lowpass filter in a predetermined polarity sense, and provides substantially no current otherwise; and
   a constant current source, having an output terminal coupled to said signal output terminal, for continuously providing a substantially constant current in a direction to cause said signal output terminal to exhibit a potential which differs from said reference potential in said predetermined polarity sense.

2. The clamp circuitry set forth in claim 1 wherein said controllable current source comprises;
   a transistor having a control electrode coupled to said comparator, and having a source electrode coupled to a source of supply potential and a drain electrode coupled to a further terminal; and
   resistive means coupled between said further terminal and said signal output terminal.

3. The clamp circuitry set forth in claim 2 wherein said resistive means includes a field effect transistor transmission gate biased into conduction.

4. The clamp circuitry set forth in claim 1 further including a further lowpass filter coupled between said comparator and said controllable current source.

5. The clamp circuitry set forth in claim 4 wherein said controllable current source comprises;
   a transistor having a control electrode coupled to said comparator, and having a principal conduction path coupled between a source of supply potential and a further terminal; and
   resistive means coupled between said further terminal and said signal output terminal.

6. The clamp circuitry set forth in claim 5 wherein said resistive means includes a field effect transistor transmission gate biased into conduction.

7. The clamp circuitry set forth in claim 4 wherein said controllable current source comprises;
   a gates amplifier, having a control terminal coupled to said comparator, having a first input terminal coupled to said source of reference potential, having a second input terminal and an output terminal;
   resistive means coupled between the second input and output terminals of said gated amplifier; and
   means for coupling an interconnection of said resistive means and said second input terminal of said gated amplifier to said signal output terminal.

8. The clamp circuitry set forth in claim 1 wherein said source of reference potential is programmable.

9. Clamping circuitry comprising:
   a signal input terminal and a signal output terminal;
   a coupling capacitor coupled between said signal input and output terminals;
   a lowpass filter having an input terminal coupled to said signal output terminal, and having an output terminal;
   a comparator have a first input terminal coupled to the output terminal of said lowpass filter, and having a second input terminal coupled to a source of reference potential, for generating a control signal related to differences between signal provided by said lowpass filter and said reference potential;
   a gated amplifier, having a control terminal coupled to said comparator, having a first input terminal coupled to said source of reference potential, having a second input terminal and an output terminal;
   resistive means coupled between the second input and output terminals of said gated amplifier; and
   means for coupling an interconnection of said resistive means and said second input terminal of said gated amplifier to said signal output terminal for providing current to said capacitor in a direction tending to establish a potential at said signal output terminal having a predetermined relationship to said reference potential when said reference potential differs from signal provided by said lowpass filter in a predetermined polarity sense, and provides substantially no current otherwise.

10. The clamp circuitry set forth in claim 9 further including a constant current source, having an output terminal coupled to said signal output terminal, for continuously providing a substantially constant current in a direction to establish said potential at said signal output terminal such that said reference potential differs from signal provided by said lowpass filter in said predetermined polarity sense.

11. Clamping circuitry comprising:
    a signal input terminal and a signal output terminal;
    a coupling capacitor coupled between said signal input and output terminals;
    a lowpass filter having an input terminal coupled to said signal output terminal, and having an output terminal;
    a comparator having an input terminal coupled to the output terminal of said lowpass filter, for generating a control signal related to differences between signal provided by said lowpass filter and a predetermined reference potential;
    a controllable current source, having a control input terminal coupled to said comparator, and an output terminal coupled to said signal output terminal, and responsive to said control signal, for providing current to said capacitor in a direction tending to cause said signal output terminal to exhibit a potential having a predetermined relationship to said predetermined reference potential when said reference potential differs from signal provided by said lowpass filter in a predetermined polarity sense, and provides substantially no current otherwise; and
    a constant current source, having an output terminal coupled to said signal output terminal, for continuously providing a substantially constant current in a direction to cause said signal output terminal to exhibit a potential which differs from said predetermined reference potential in said predetermined polarity sense.

12. The clamp circuitry set forth in claim 11 further including;
    a further lowpass filter coupled between said comparator and said controllable current source.

13. The clamp circuitry set forth in claim 12 wherein said controllable current source comprises;
    a transistor having a control electrode coupled to said comparator, and having a source electrode coupled to a source of supply potential and a drain electrode coupled to a further terminal; and
    resistive means coupled between said further terminal and said signal output terminal.

* * * * *